United States Patent [19]

Anderson

[11] Patent Number: 5,274,530
[45] Date of Patent: Dec. 28, 1993

[54] MODULE FOR PROTECTING AND COOLING COMPUTER CHIP DIE MOUNTED ON A THIN FILM SUBSTRATE AND A CHASSIS FOR CONDUCTION COOLING OF SUCH MODULES

[76] Inventor: William B. Anderson, 12751 Lockleven La., Woodbridge, Va. 22192

[21] Appl. No.: 890,237

[22] Filed: May 29, 1992

[51] Int. Cl.⁵ ............................................. H05K 7/20
[52] U.S. Cl. ................................... 361/689; 361/704; 361/707; 361/694
[58] Field of Search .............................. 361/382–389, 361/391–394, 396, 399

[56] References Cited

U.S. PATENT DOCUMENTS

| | | |
|---|---|---|
| 2,909,714 | 10/1959 | Diebold . |
| 2,936,409 | 5/1960 | Jackson et al. . |
| 3,364,987 | 1/1968 | Bylund et al. . |
| 3,648,113 | 3/1972 | Rathjen et al. ............... 361/388 |
| 3,967,874 | 7/1976 | Calabro . |
| 4,000,509 | 12/1976 | Jarvela . |
| 4,417,295 | 11/1983 | Stuckert . |
| 4,502,100 | 2/1985 | Greenspan et al. . |
| 4,536,824 | 8/1985 | Barrett et al. . |
| 4,748,495 | 5/1988 | Kucharek . |
| 4,758,926 | 7/1988 | Herrell et al. . |
| 4,829,402 | 5/1989 | Gewebler et al. ............... 361/383 |
| 4,841,355 | 6/1989 | Parks . |
| 4,858,070 | 8/1989 | Buron et al. ............... 361/391 |
| 4,963,414 | 10/1990 | LeVasseur et al. ............... 361/386 |
| 5,001,548 | 5/1991 | Iversen . |
| 5,006,925 | 4/1991 | Bregman et al. . |

FOREIGN PATENT DOCUMENTS

| | | |
|---|---|---|
| 0292696 | 11/1988 | Japan ............... 361/383 |
| 2052164 | 1/1991 | United Kingdom ............... 361/383 |

OTHER PUBLICATIONS

"Low-Profile Ceramic-Card Package", IBM Technical Disclosure Bulletin, vol. 28, No. 5, Oct. 1985, pp. 2114–2115.

Primary Examiner—Gregory D. Thompson
Attorney, Agent, or Firm—Hill, Steadman & Simpson

[57] ABSTRACT

An electronic module and chassis for receiving a number of such modules wherein the modules are formed with bare die chips which are directly connected to substrate and metal cover plates which form opposite sidewalls of the modules. The chassis has cooling passages which are formed by metal sidewalls that form slots into which the modules are received so that coolant can provide conduction cooling.

6 Claims, 2 Drawing Sheets

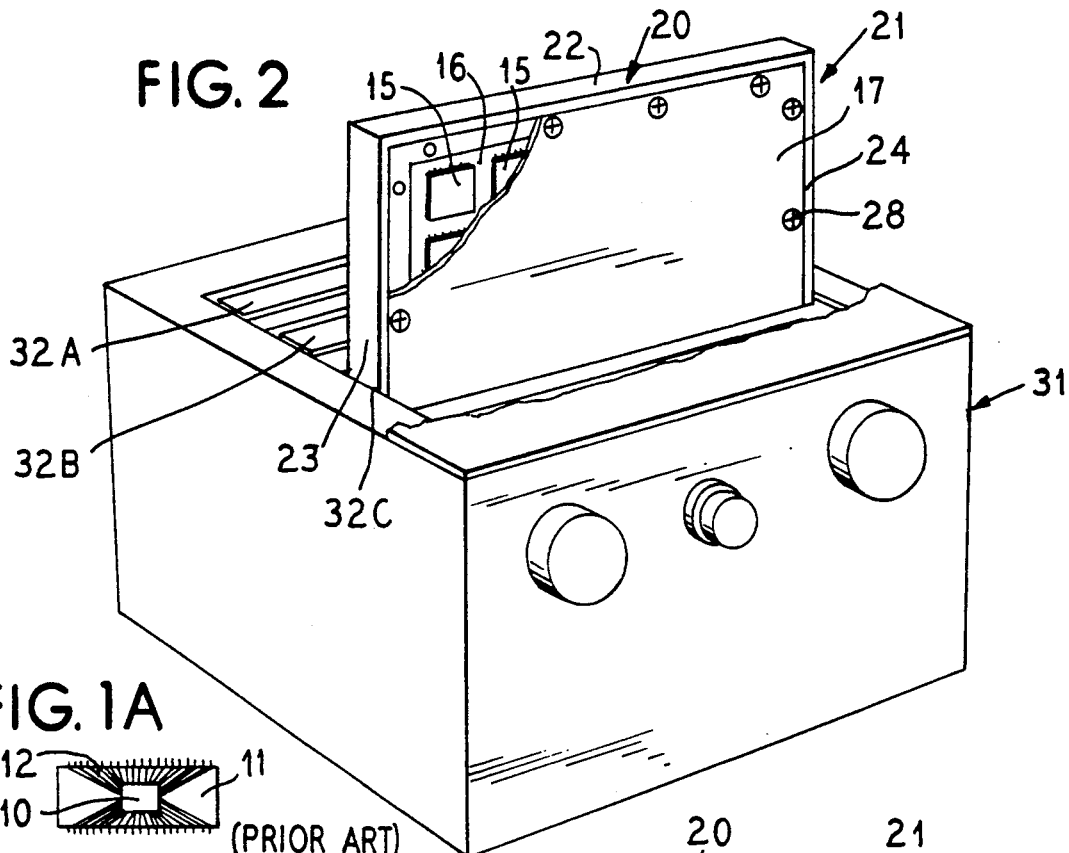
FIG. 2
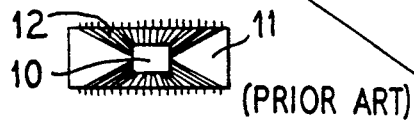
FIG. 1A (PRIOR ART)
FIG. 1B (PRIOR ART)
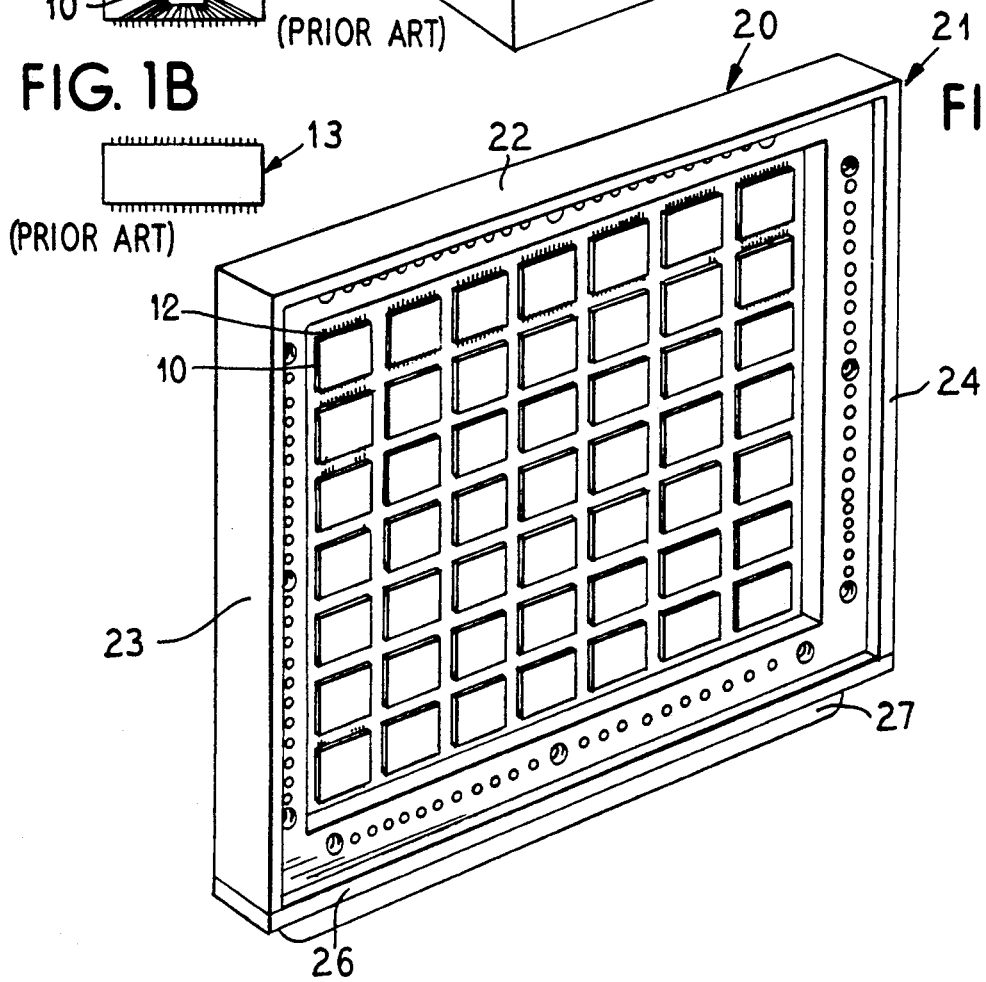
FIG. 3

MODULE FOR PROTECTING AND COOLING COMPUTER CHIP DIE MOUNTED ON A THIN FILM SUBSTRATE AND A CHASSIS FOR CONDUCTION COOLING OF SUCH MODULES

BACKGROUND OF THE INVENTION

1. Field of the Invention

This invention relates in general to a new module for protecting and conduction cooling computer chip dies mounted on a thin film substrate and also to a new chassis for conduction cooling of such modules.

2. Description of Related Art

Today's computer chips are usually forms of a CMOS die hermetically sealed in a plastic or ceramic chip support. Computer chips have historically evolved into higher and higher density die and current applications utilized chip carriers mounted on one or both sides of single or multilayer printed circuit boards. In the prior art, printed circuit boards upon which the chip supports are mounted are attached to a metal heat sink mounted between two printed circuit boards which remove the heat from the modules.

Other examples of such structures are illustrated by the following U.S. Pat. Nos. 4,417,295, 4,502,100, 4,536,824, 3,967,874, 5,001,548, 2,936,409, 2,909,714, 3,364,987, 4,748,495, 4,841,355, 4,000,509, 4,758,926, 5,006,925, 4,956,746 and 3,737,728.

SUMMARY OF THE INVENTION

The present invention comprises a novel module for protecting and conduction cooling of computer chip die mounted on a thin film substrate and a new chassis for conduction cooling of such modules.

The novel module for protection and conduction cooling of computer chip die mounted on a thin film substrate comprises mounting the computer chip die on a printed circuit substrate wherein the bare die is bonded directly to the module of the printed circuit substrate and the substrate is attached to a metal plate for the module so that heat from the substrate and dies will pass into the metal plate to the outside of the module. The other side of the module carries another substrate with bare die bonded components and its outer surface is covered by a metal heat cover plate. The heat passes directly from the bare die bonded components and printed circuit substrate into the metal cover plate of the module so that it can be removed. The modules are mounted in a chassis which has walls which directly engage the cover plates of the module and cooling passages are formed between each of the modules and so as cool the walls so as to directly remove heat from the modules. Thus, the modules are formed as an exoskeleton form wherein the outer supporting structure serves as the heat removing means.

The module may be hermetically sealed and the computer dies on the cover plates and the module body communicate electrically with each other and through the bottom connector formed through the module body which interconnects with other portions of the electrical circuit. The chassis spaces between the module provide air passages for forced air cooling of the modules. Of course, the modules can also be cooled by liquid if desired.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1A shows a picture of a computer chip die in a chip support;

FIG. 1B illustrates a die enclosed in a chip support;

FIG. 2 is a perspective view illustrating a chassis for conduction cooling with one of the modules of the invention partially removed from the chassis;

FIG. 3 is an enlarged perspective view of the module with one cover side removed;

DETAILED DESCRIPTION OF THE PREFERRED EMBODIMENTS

Figure 4:
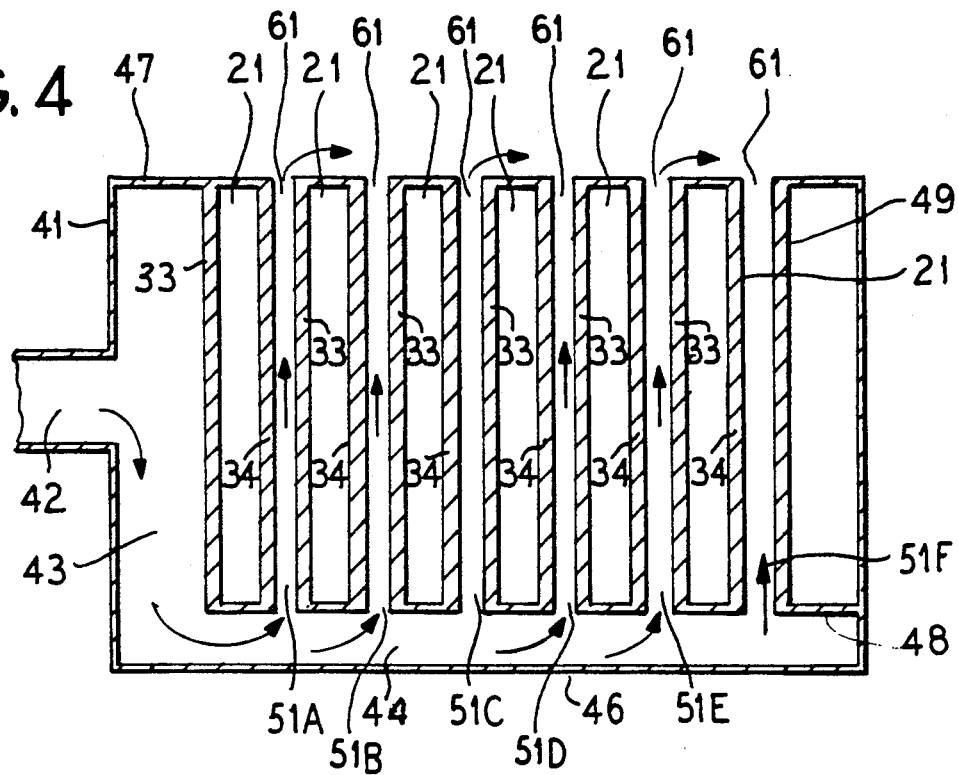
FIG. 4 is a top sectional view through the chassis illustrating the cooling ducts.

FIG. 1A illustrates showing a die 10 mounted on a support 11 from which the various connectors 12 of the die extend. FIG. 1B illustrates a typical chip support of the prior art wherein the die and support of FIG. 1A is encapsulated in a chip carrier 13. It has been conventional to mount the dies 10 and supports 11 illustrated in FIG. 1A in a encapsulated chip support 13 as shown in FIG. 1B. According to the present invention, the die 10 and conductors 12 are directly mounted on a printed wiring board printed circuit substrate 16. Each of the bare die bonding chips is indicated by 15 in the FIGS.

Figure 5:
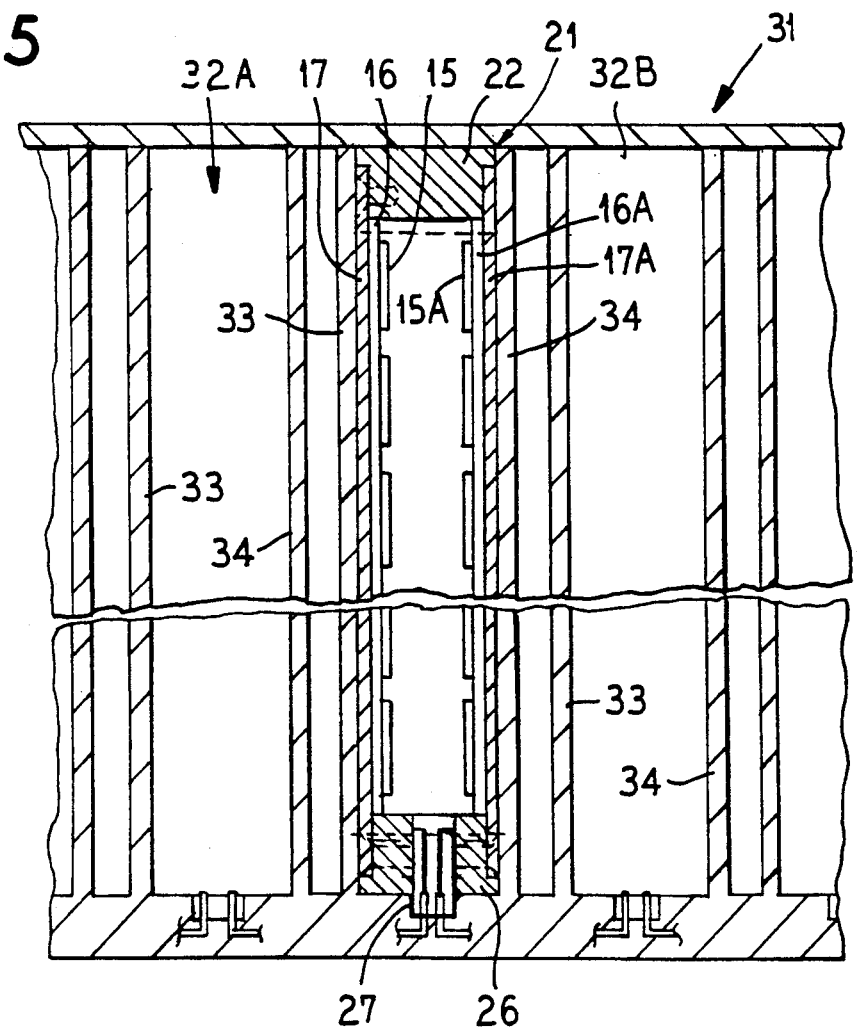
FIG. 5 is an enlarged sectional view illustrating the cooling ducts for the modules.

As shown in FIG. 5 the substrate 16 is attached to an outer cover plate 17 which forms the outer cover of the module. The other side of the module 21 is closed with a second cover plate 17A and on the inside surface there is another printed circuit wiring board 16A upon which a plurality of dies 15A are mounted. The metal outer cover plates 17 and 17A are mounted to the frame of the module 21 which is formed of an aluminum alloy and includes a top cover member 22 and opposite sidewalls 23 and 24 and a bottom cover 26. The bottom cover 26 is formed with an electrical connector 27 through which electrical inputs and outputs to the various electrical components in the module 21 are made. The outer cover plate such as outer cover plates 17 and 17A are attached to the module 21 by set screws 28 which are received in edge portions 29 such as illustrated in FIG. 2.

As shown in FIGS. 2, 4 and 5 a plurality of modules 21 are receivable in a chassis 31 which is formed with slots 32B, 32C for the modules 21. Each of the slots 32A and 32B are formed by sidewalls such as sidewalls 33 and 34 illustrated in FIGS. 4 and 5 in which modules 21 are received. The chassis 31 has a rear wall 41 with an air inlet 42 which supplies air into a plenum chamber 43 which supplies air or other coolant to one side 44 of the chassis adjacent air plenum sidewall 46. Partitions 47 and 48 and 49 guide coolant which passes through the air passages 51A through 51E formed between the sidewalls 33 and 34 in which each of the modules 21 is mounted so as to remove the heat from the modules. Exhaust exits the chassis through exhaust parts 61 on the side of the chassis.

Since each of the modules 21 are in intimate contact with the sidewalls 33 and 34 and heat generated within the modules 21 will pass through the walls of the cover plates 17 and 17A into the sidewalls 33 and 34 and the cooling air will remove the heat from the sidewalls 33 and 34 as it passes through the passages 51A, 51B, 51C, 51D, and 51E. Since the heat is removed by direct conduction from the inside of the modules 21 through the cover plates 17 and 17A and sidewalls 33 and 34 very efficient cooling will result.

It is seen that the invention provides a new module which is much more efficient in the use of than the prior art devices as well as providing a new and novel chassis for mounting and cooling such modules.

Although the invention has been described with respect to preferred embodiments, it is not to be so limited as changes and modifications can be made which are within the full intended scope of the invention as defined by the appended claims.

I claim as our invention:

1. An electric apparatus for electrical circuits comprising, a chassis formed with a narrow plenum chamber coolant passage running from the rear of the chassis along the length and depth of one side of the chassis and a plurality of parallel module receiving cavities with each of said module receiving cavities formed with parallel first and second spaced sidewalls which extend for the full width except for the plenum chamber width and which extend for the full depth of said chassis and said first and second spaced sidewalls formed of material having high thermal conductivity, a plurality of modules each received into one of said plurality of parallel module receiving cavities and each of said modules formed with first and second cover plates and said first and second cover plates extend for the full widths of said parallel module receiving cavities and said first and second cover plates have high thermal conductivity and the entire surface of said first cover plate in contact with the first parallel spaced sidewall of one of said parallel module receiving cavities and the entire surface of said second cover plate in contact with the second parallel spaced sidewall of one of said parallel module receiving cavities when the module is in said chassis, and a plurality of parallel coolant passages formed between said plurality of module receiving cavities and in fluid communication with said narrow plenum chamber and coolant supplied to said chassis so as to pass through said plenum chamber and through the plurality of parallel spaced coolant passages so as to cool the surfaces of said first and second parallel spaced sidewalls of said module receiving cavities and thus cool said modules.

2. An electronic apparatus for electrical circuits according to claim 1 wherein said chassis has a coolant inlet which communicates with said coolant passages and said chassis has coolant outlets which receive said coolant after it has passed through said coolant passages.

3. An electronic apparatus for electrical circuits according to claim 2 wherein said parallel spaced sidewalls of said module receiving cavities are formed of metal.

4. An electronic apparatus according to claim 2 wherein each of said plurality of modules contain a plurality of electrical components mounted in said module at least some of which are in thermal conduction relationship to the cover plates of said modules.

5. An electronic apparatus according to claim 4 wherein said some electrical components are bare dies.

6. An electronic apparatus according to claim 5 wherein said cover plates of said modules are metal and said bare dies are directly mounted on substrates which are attached to said metal cover plates.

* * * * *